(12) United States Patent
Tran et al.

(10) Patent No.: US 11,520,946 B2
(45) Date of Patent: Dec. 6, 2022

(54) CLOUD-BASED FIRE PROTECTION SYSTEM AND METHOD

(71) Applicant: JOHNSON CONTROLS FIRE PROTECTION LP, Boca Raton, FL (US)

(72) Inventors: Liem-Binh Tran, Saint-Hubert (CA); David-Alexandre Bourbonnais, Candiac (CA)

(73) Assignee: Johnson Controls Tyco IP Holdings LLP, Milwaukee, WI (US)

(*) Notice: Subject to any disclaimer, the term of this patent is extended or adjusted under 35 U.S.C. 154(b) by 871 days.

(21) Appl. No.: 16/379,374

(22) Filed: Apr. 9, 2019

(65) Prior Publication Data
US 2020/0327202 A1    Oct. 15, 2020

(51) Int. Cl.
| | |
|---|---|
| *G06F 9/54* | (2006.01) |
| *G06F 30/00* | (2020.01) |
| *G06N 20/00* | (2019.01) |
| *G08B 17/00* | (2006.01) |
| *G08B 26/00* | (2006.01) |
| *G08B 27/00* | (2006.01) |

(52) U.S. Cl.
CPC .............. *G06F 30/00* (2020.01); *G06F 9/542* (2013.01); *G06N 20/00* (2019.01); *G08B 17/00* (2013.01); *G08B 26/007* (2013.01); *G08B 27/005* (2013.01)

(58) Field of Classification Search
CPC .... G06F 9/4812; G06F 9/542; G06F 17/5009; G06F 17/5018; H04L 29/06
USPC .............................................. 719/318; 703/6
See application file for complete search history.

(56) References Cited

U.S. PATENT DOCUMENTS

| | | | |
|---|---|---|---|
| 9,905,107 B2* | 2/2018 | Chong | G08B 21/0453 |
| 11,196,798 B2* | 12/2021 | Li | H04L 67/06 |
| 2015/0142898 A1 | 5/2015 | Piccolo, III | |
| 2016/0098305 A1 | 4/2016 | Bucsa et al. | |
| 2018/0293864 A1 | 10/2018 | Wedig et al. | |
| 2019/0096217 A1 | 3/2019 | Pourmohammad et al. | |

FOREIGN PATENT DOCUMENTS

| | | |
|---|---|---|
| EP | 3276554 A1 | 1/2018 |
| WO | 2019028269 A2 | 2/2019 |

OTHER PUBLICATIONS

International Search Report and Written Opinion issued in International Patent Application No. PCT/US2020/027146 dated Jun. 26, 2020.

\* cited by examiner

*Primary Examiner* — Andy Ho
(74) *Attorney, Agent, or Firm* — ArentFox Schiff LLP (57) ABSTRACT

A system performs cloud-based fire protection. The system receives, by a cloud platform, data from one or more initiating devices. The system stores the data in a persistent data storage of the cloud platform over a period of time. The system applies machine learning to the data to build or adjust a predictive detection model. The system processes, by computing resources of the cloud platform, the data using the predictive detection model to determine an existence of a safety event. The system then transmits, to at least one notification device, an event notification in response to the existence of the safety event.

20 Claims, 4 Drawing Sheets

CLOUD-BASED FIRE PROTECTION SYSTEM AND METHOD

BACKGROUND

The present disclosure relates generally to fire protection, and more particularly, to de-centralized fire protection.

A fire alarm system within a building is typically a closed/local system including initiating devices and notification devices connected to an on premise fire alarm control panel. The input from the initiating devices is processed by the fire alarm control panel using pre-configured algorithms to determine whether a detected device state triggers an event such as a fire. If an event is detected, the fire alarm control panel may activate one or more notification devices accordingly. However, the fire alarm control panel is a single point of failure of such conventional fire alarm systems. For example, if the fire alarm control panel becomes unavailable or malfunctions, the initiating and notification devices are no longer operational for detecting and/or warning against fire or other critical events.

Accordingly, improvements in fire protection systems are desired.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

The present disclosure provides fire protection systems, apparatuses, and methods.

In an aspect, a method of cloud-based fire protection includes receiving, by a cloud platform, data from one or more initiating devices. The method further includes storing the data in a persistent data storage of the cloud platform over a period of time. The method further includes applying machine learning to the data to build or adjust a predictive detection model. The method further includes processing, by computing resources of the cloud platform, the data using the predictive detection model to determine an existence of a safety event. The method further includes transmitting, to at least one notification device, an event notification in response to the existence of the safety event.

In a further aspect, a system for cloud-based fire protection includes one or more processors providing computing resources for a cloud platform, and a memory storing instructions that, when executed by the one or more processors, cause the one or more processors to receive, by the cloud platform, data from one or more initiating devices. The instructions, when executed by the one or more processors, further cause the one or more processors to store the data in a persistent data storage of the cloud platform over a period of time. The instructions, when executed by the one or more processors, further cause the one or more processors to apply machine learning to the data to build or adjust a predictive detection model. The instructions, when executed by the one or more processors, further cause the one or more processors to process the data using the predictive detection model to determine an existence of a safety event. The instructions, when executed by the one or more processors, further cause the one or more processors to transmit, to at least one notification device, an event notification in response to the existence of the safety event.

In another aspect, a non-transitory computer-readable medium stores instructions that, when executed by one or more processors providing computing resources for a cloud platform, cause the one or more processors to receive, by the cloud platform, data from one or more initiating devices. The instructions, when executed by the one or more processors, further cause the one or more processors to store the data in a persistent data storage of the cloud platform over a period of time. The instructions, when executed by the one or more processors, further cause the one or more processors to apply machine learning to the data to build or adjust a predictive detection model. The instructions, when executed by the one or more processors, further cause the one or more processors to process the data using the predictive detection model to determine an existence of a safety event. The instructions, when executed by the one or more processors, further cause the one or more processors to transmit, to at least one notification device, an event notification in response to the existence of the safety event.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components may be shown in block diagram form in order to avoid obscuring such concepts.

Aspects of the present disclosure provide methods, apparatuses, and systems that allow for de-centralized cloud-based fire protection functionality. In an aspect, for example, a de-centralized cloud-based fire protection system includes initiating devices that communicate with a cloud platform independently of one another through one or more paths, for example, over the Internet. Further, the cloud platform also communicates with one or more notification devices independently of one another through one or more paths, for example, over the Internet. Accordingly, the need for a fire alarm control panel is alleviated. Further, since the devices in the present system are coupled with a cloud platform through one or more hubs, routers, gateways, or some combination thereof, the system is not dependent on a single on premise processing node such as a fire alarm control panel, and therefore there is no single point of failure. Additionally, service level agreement of a cloud provider may be configured to guarantee a certain level of system availability, for example, up to 99.99%, for data computing and data storage, thus ensuring high reliability in a de-centralized cloud-based fire protection system.

In an aspect, for example, the output or sensor value of each initiating device in the present de-centralized cloud-based fire protection system is sent to the cloud platform and is processed in the cloud platform according to an appropriate business logic. In this aspect, the cloud platform may be flexible to provide any required computing capacity. Additionally, the cloud platform may activate one or more notification devices in the de-centralized cloud-based fire protection system if the processing of the sensor values indicates a safety event, such as a fire event.

In an aspect, the cloud platform may further provide a persistent data storage for storing the raw sensor data received from the initiating devices. In an aspect, for example, the persistent data storage may store sufficient data over time to enable characterization of the environment where the initiating devices are located within the de-centralized cloud-based fire protection system. In an aspect, for example, the stored data may be analyzed to develop new fire detection/protection algorithms, and the data may be fed back into the de-centralized cloud-based fire protection system in order to adapt the fire detection/protection algorithm in real-time using machine learning capabilities in the cloud platform.

In an aspect, an initiating or notification device may be added to the de-centralized cloud-based fire protection system by configuring a communication pathway of the device to the Internet, instead of or in addition to configuring a local fire alarm control panel. For example, in an aspect, an initiating or notification device may be added to the de-centralized cloud-based fire protection system by configuring the device to connect to one or more hubs, routers, gateways, or some combination thereof that provide a wired or wireless connection to the Internet. In an aspect, for example, the initiating or notification device may be configured to connect to one or more hubs, routers, gateways, or some combination thereof over a wired connection, for example, using an Ethernet connection. Alternatively and/or additionally, the initiating or notification device may be configured to connect wirelessly to one or more hubs, routers, gateways, or some combination thereof, for example, using a wireless fidelity (WiFi) connection. Alternatively and/or additionally, an initiating or notification device may be configured to directly connect to the Internet, for example, using a cellular connection. In some aspects, an initiating or notification device may implement multiple redundant pathways for communicating over the Internet. For example, in one non-limiting aspect, an initiating or notification device may implement both an Ethernet connection to one or more hubs, routers, gateways, or some combination thereof, and a cellular connection to directly connect to the Internet. In aspects where multiple redundant pathways are implemented, the initiating or notification device may use one pathway by default, and then later switch to an alternative pathway in case of a failure of the default pathway. For example, in an aspect, the initiating or notification device may use an Ethernet connection by default, and then switch to a cellular connection in case of a failure of the Ethernet connection.

In an aspect, the de-centralized cloud-based fire protection system may provide safety event notifications, such as fire alarms, through one or more on premise audible and/or visual fire alarm notification devices. Alternatively and/or additionally, the de-centralized cloud-based fire protection system may provide safety event notifications through other devices such as a personal computer, a personal mobile phone, etc. For example, in an aspect, the de-centralized cloud-based fire protection system may provide safety event notifications including but not be limited to e-mail, short message service (SMS), mobile application notification, web application notification, notifications on an interface dashboard of the cloud platform, etc. In an aspect, the cloud platform may provide functionality to facilitate the integration of different types of notification devices such as on premise notification devices, personal computers, personal mobile phones, etc.

In an aspect, the de-centralized cloud-based fire protection system may be configured by retrofitting a conventional fire protection system. For example, a conventional fire protection system that includes physical connections from initiating and notification devices to a fire alarm control panel may be retrofitted such that the fire alarm control panel no longer processes the business logic of the fire protection system but is instead configured as a gateway to the Internet to couple the initiating and notification devices with a cloud platform that processes the business logic.

As compared to conventional fire alarm systems in which initiating and notification devices are connected to a fire alarm control panel that does not store device input, the present de-centralized cloud-based fire protection system allows for persistent storage of device input over time and for using the stored data for further analysis. Additionally, unlike the conventional fire alarm control panels which are a single point of failure in a conventional fire protection system, each device in the present de-centralized cloud-based fire protection system may independently communicate with the cloud platform and is therefore operable irrespective of the status of other devices/components in the de-centralized cloud-based fire protection system. Further, unlike conventional fire alarm control panels that have limited processing capability, the cloud platform in the present de-centralized cloud-based fire protection system can accommodate processing of complex business logic for a large number of devices. In addition, the present de-centralized cloud-based fire protection system has reduced manufacturing and storage cost, has reduced system parts for the initiating and notification devices, is easier to install and configure, has higher visibility and ease of use for fire system operations, has reduced maintenance cost, can facilitate future device integration, and can allow for further device data analysis, e.g., by using big data functionality.

Turning now to the figures, example aspects are depicted with reference to one or more components described herein, where components in dashed lines may be optional.

Figure 1:
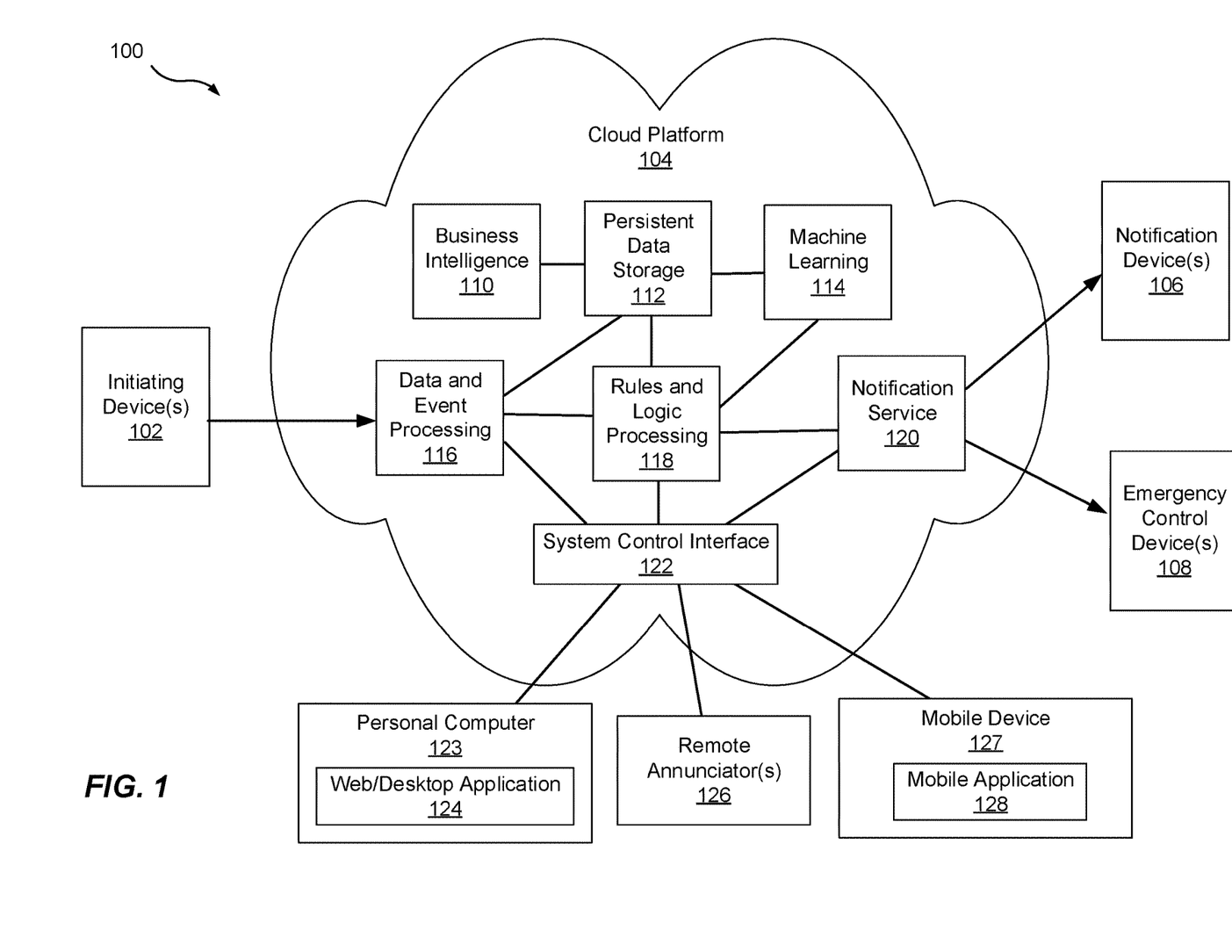
FIG. 1 is a schematic diagram of a de-centralized cloud-based fire protection system.

Referring to FIG. 1, in one non-limiting aspect, a de-centralized cloud-based fire protection system 100 includes a cloud platform 104 that receives data from one or more initiating devices 102, processes the data, and depending on the outcome of the processing, sends a safety event notification to one or more notification devices 106 and/or one or more emergency control devices 108 if needed. In an aspect, the initiating devices 102 may include, for example, on premise fire protection devices such as smoke detectors, manual stations, waterflow switches, sprinkler supervisory switches, or any other device configured for initiating a fire or other safety alarm by detecting a safety or fire condition.

In an aspect, the notification devices 106 may include, for example, audible devices, visible devices, or any other on premise fire/safety alarm device configured for warning the occupants of an area in case of a detected safety event. In an alternative and/or additional aspect, the notification devices 106 may further include personal devices such as personal computers, personal mobile devices, etc., that are configured for warning the user of the device in case of a detected safety event. In an aspect, the emergency control devices 108 may include, for example, ventilation system fans and/or dampers, door locks, hold open devices, a safety/alarm device configured at a fire department, or any other device configured for providing a notification and/or taking a mitigating action in response to a detected safety event.

In an aspect, the cloud platform 104 may communicate with the initiating devices 102, the notification devices 106, and/or the emergency control devices 108 over the Internet, e.g., by implementing communication according to one or more protocols in the Internet protocol suit, or transmission control protocol/internet protocol (TCP/IP). In an aspect, for example, one or more of the initiating devices 102, the notification devices 106, and/or the emergency control devices 108 may be an Internet of Things (IoT) device capable of independently establishing communication with the cloud platform 104 over the Internet. Alternatively and/or additionally, one or more of the initiating devices 102, the notification devices 106, and/or the emergency control devices 108 may connect to the Internet via one or more hubs, routers, gateways, or some combination thereof, and may thus have a wired or wireless connection to one or more hubs, routers, gateways, or some combination thereof, for example, via WiFi, Ethernet, etc. Alternatively and/or additionally, one or more of the initiating devices 102, the notification devices 106, and/or the emergency control devices 108 may connect to the Internet via a cellular communication. Accordingly, each one of the initiating devices 102, the notification devices 106, and/or the emergency control devices 108 may communicate with the cloud platform 104 over the Internet via one or more direct or indirect communication paths.

In an aspect, various network topologies may be implemented to allow for each of the initiating devices 102, the notification devices 106, and/or the emergency control devices 108 to connect to the Internet to communicate with the cloud platform 104. For example, in one non-limiting aspect, one or more of the initiating devices 102, the notification devices 106, and/or the emergency control devices 108 may communicate with the cloud platform 104 in a star topology through one or more hubs, routers, gateways, or some combination thereof that provide access to the Internet. Alternatively, in another non-limiting aspect, one or more of the initiating devices 102, the notification devices 106, and/or the emergency control devices 108 may form a mesh network to relay messages among each other and connect to the Internet.

In an aspect, the communication path between an initiating device 102 and the cloud platform 104 may allow for the transmission of sensor outputs of the initiating device 102 to the cloud platform 104. In an aspect, the communication path between a notification device 106 and the cloud platform 104 may allow for the transmission of requests from the cloud platform 104 to activate the notification device 106. In an aspect, each one of the initiating devices 102, the notification devices 106, and/or the emergency control devices 108 may be associated with a physical location. In an aspect, one or more of the initiating devices 102, the notification devices 106, and/or the emergency control devices 108 may be logically grouped together based on their respective physical location. For example, one or more of the initiating devices 102, the notification devices 106, and/or the emergency control devices 108 may be logically grouped together at different levels of granularity, for example, by zone, building floor, building section, building, building complex, campus, etc. Accordingly, one or more of the initiating devices 102, the notification devices 106, and/or the emergency control devices 108 may communicate with the cloud platform 104 to collectively provide a fire alarm system associated with a geographical or logical system without the need for association with a specific local fire panel control unit.

In an aspect, an initiating device 102 may be a digital sensor device, for example, a manual pull station. In this case, the initiating device 102 may provide digital device values to the cloud platform 104. In response, the cloud platform 104 may perform data and event processing 116 to aggregate and/or filter the digital device values received from the initiating device 102 and then send the filtered and/or aggregated digital device values to other components of the cloud platform 104 such as a persistent data storage 112, a system control interface 122, and/or for rules and logic processing 118. For example, in an aspect, the rules and logic processing 118 performed on the output of the data and event processing 116 may include triggering an immediate state change associated with the initiating device 102. The rules and logic processing 118 may then determine whether to generate a safety event. If a safety event is generated, a notification service 120 of the cloud platform 104 may send corresponding notifications to one or more notification devices 106 and/or emergency control devices 108. For example, the cloud platform 104 may activate the notification functionality of one or more notification devices 106, and/or may activate a safety event mitigating functionality of an emergency control devices 108.

In an aspect, an initiating device 102 may be an analog sensor device, for example, a smoke detector or a pressure sensor. In this case, the initiating device 102 may provide analog device values to the cloud platform 104. In response, the cloud platform 104 may perform data and event processing 116 on the analog device values received from the initiating devices 102. For example, in an aspect, the data and event processing 116 may filter and/or aggregate the analog device values received from the initiating devices 102 and then send the filtered and/or aggregated analog device values to other components of the cloud platform 104 such as the persistent data storage 112, the system control interface 122, and/or for the rules and logic processing 118.

For example, in an aspect, the cloud platform 104 may perform the rules and logic processing 118 on the output of the data and event processing 116 by comparing the analog device values against a configurable threshold range/value to trigger a state change associated with the initiating device 102 if the analog device values are not within an acceptable range. In an aspect, the threshold value may be configured manually or may be computed using machine learning 114 and configured automatically by the cloud platform 104.

Alternatively and/or additionally, for example, in an aspect, the cloud platform 104 may perform the rules and logic processing 118 on the output of the data and event processing 116 by identifying a signal pattern of the analog device values to trigger a state change associated with the initiating device 102 if the signal pattern of the analog device values matches a pattern associated with a safety event. In an aspect, the signal pattern of the analog device values may be identified, for example, by applying signal processing techniques such as pattern recognition on the analog device values. In an aspect, for example, the patterns associated with safety events may be configured/stored manually or may be computed using machine learning 114 and configured automatically by the cloud platform 104 based on historical event and/or sensor data stored in the persistent data storage 114.

In response to a triggered state change, the rules and logic processing 118 may determine whether to generate a corresponding safety event. If a safety event is generated, a notification service 120 of the cloud platform 104 may send corresponding notifications to one or more notification devices 106 and/or emergency control devices 108.

In an alternative aspect, an initiating device 102 may be an intelligent analog sensor device that generates analog device values and also has processing capability to locally process the analog device values against a configurable threshold to detect a state change. In this aspect, the initiating device 102 may send the state change along with the analog device values to the cloud platform 104. Again, the threshold value may be configured manually or may be computed using machine learning 114 and configured automatically by the cloud platform 104.

In an aspect, the cloud platform 104 may generate one or more events by processing the received sensor data by performing rules and logic processing 118 according to business rules and logic. The rules and logic processing 118 may indicate which notification devices 106 need to be activated in case of an event, and the cloud platform 104 may trigger such notification devices 106 accordingly. In an aspect, the notification devices 106 may receive activation commands from the cloud platform 104 through similar communication path(s) used by the initiating devices 102, e.g., Wi-Fi, Ethernet, cellular communication, etc. The rules and logic processing 118 may also trigger a cascade of actions including but not limited to sending notifications by e-mail, SMS, mobile application, and/or directly to a central monitoring station. Alternatively and/or additionally, for example, in an aspect, the rules and logic processing 118 may trigger the cloud platform 104 to send notifications/requests to other services such as fire and rescue, ambulance, etc.

In an aspect, the cloud platform 104 may provide a persistent data storage 112 for storing the raw data received from the initiating devices 102. In an aspect, for example, the persistent data storage 112 may store sufficient data over time to enable characterization of the environment where the initiating devices 102 are located within the de-centralized cloud-based fire protection system 100. In an aspect, the data analysis may be used to develop new fire detection/protection algorithms, and the data may be provided as feed back into the de-centralized cloud-based fire protection system 100 in order to adapt the fire detection/protection algorithm in real-time using machine learning 114 in the cloud platform 104. In an aspect, the data stored in the persistent data storage 112 may further be used for obtaining business intelligence 110 about the environment that is protected by the de-centralized cloud-based fire protection system 100. For example, in an aspect, the business intelligence 110 may provide information for making business decisions related to the environment that is protected by the de-centralized cloud-based fire protection system 100.

In an aspect, the cloud platform 104 may continuously and/or periodically monitor the connectivity of the initiating devices 102 and the notification devices 106 to the cloud platform 104 and ensure that device connections are reported within an acceptable time limit. For example, in one non-limiting aspect, the cloud platform 104 may require that one or more of the initiating devices 102 or the notification devices 106 provide a respective connectivity report every 2 to 5 seconds. In an aspect, for example, a regulatory entity may provide rules that define the maximum allowed time limit for detecting a device communication fault that needs to be reported on premise.

In an aspect, the cloud platform 104 may detect a loss of connection if an initiating devices 102 or a notification devices 106 fails to provide a connectivity report within an acceptable time limit. In response to detecting a loss of connection, the cloud platform 104 may report the loss, for example, as a trouble/fault event transmitted to a remote annunciator 126 coupled with the cloud platform 104 via a system control interface 122 of the cloud platform 104. In an aspect, for example, the remote annunciator 126 may be an on premise remote front panel annunciator configured to display system status information and/or allow for remote control of the de-centralized cloud-based fire protection system 100, and the trouble/fault event may indicate that the disconnected device requires attention/maintenance. In one non-limiting aspect, for example, the remote annunciator 126 may include a liquid crystal display (LCD), a light-emitting diode (LED), etc., configured for providing alpha-numeric status information. The remote annunciator 126 may also include one or more switches/buttons configured for providing system control functionality.

In an aspect, the system control interface 122 provides an interface for interacting with the cloud platform 104. For example, in an aspect, the system control interface 122 may couple the cloud platform 104 with a web/desktop application 124 running in a personal computer 123 and/or a mobile application 128 running on a mobile device 127 such that a user may configure or monitor the de-centralized cloud-based fire protection system 100 via the web/desktop application 124 and/or the mobile application 128, for example, as described below with reference to FIG. 2. In one non-limiting aspect, for example, the mobile device 127 may be a handheld device carried by a user or a safety personnel.

Unlike conventional fire alarm systems where a device malfunction or a broken physical connection to an on premise fire alarm control panel affects the operation and reduces the quality of service of the remaining devices on the system, each initiating device 102 and notification device 106 in the present aspects operates independently and therefore a malfunction of one device does not affect the entire de-centralized cloud-based fire protection system 100. More specifically, in a conventional fire alarm system, multiple devices may be configured on a physical connection ring connected to an on premise fire alarm control panel, and the integrity of communication over the ring is dependent on the integrity of each device comprising the ring. Therefore, a malfunction of a device configured on a ring may affect the operation of the other devices configured on that same ring. However, in the present de-centralized cloud-based fire protection system 100, each initiating device 102 and notification device 106 may independently communicate with the cloud platform 104. Therefore, a malfunction of one device does not affect the operation of a set of other devices. Further, in an aspect, each initiating device 102 and notification device 106 may be configured to use two or more different communication paths to the cloud platform 104 to ensure the connectivity of that device. For example, in one non-limiting aspect, a device may be configured with a default Ethernet connection and a back-up cellular connection, and in case an entire building Ethernet network malfunctions or goes down, the device may switch from the Ethernet connection to the cellular connection as a redundant communication path to the cloud platform 104 to ensure continued operation of the device.

Figure 2:
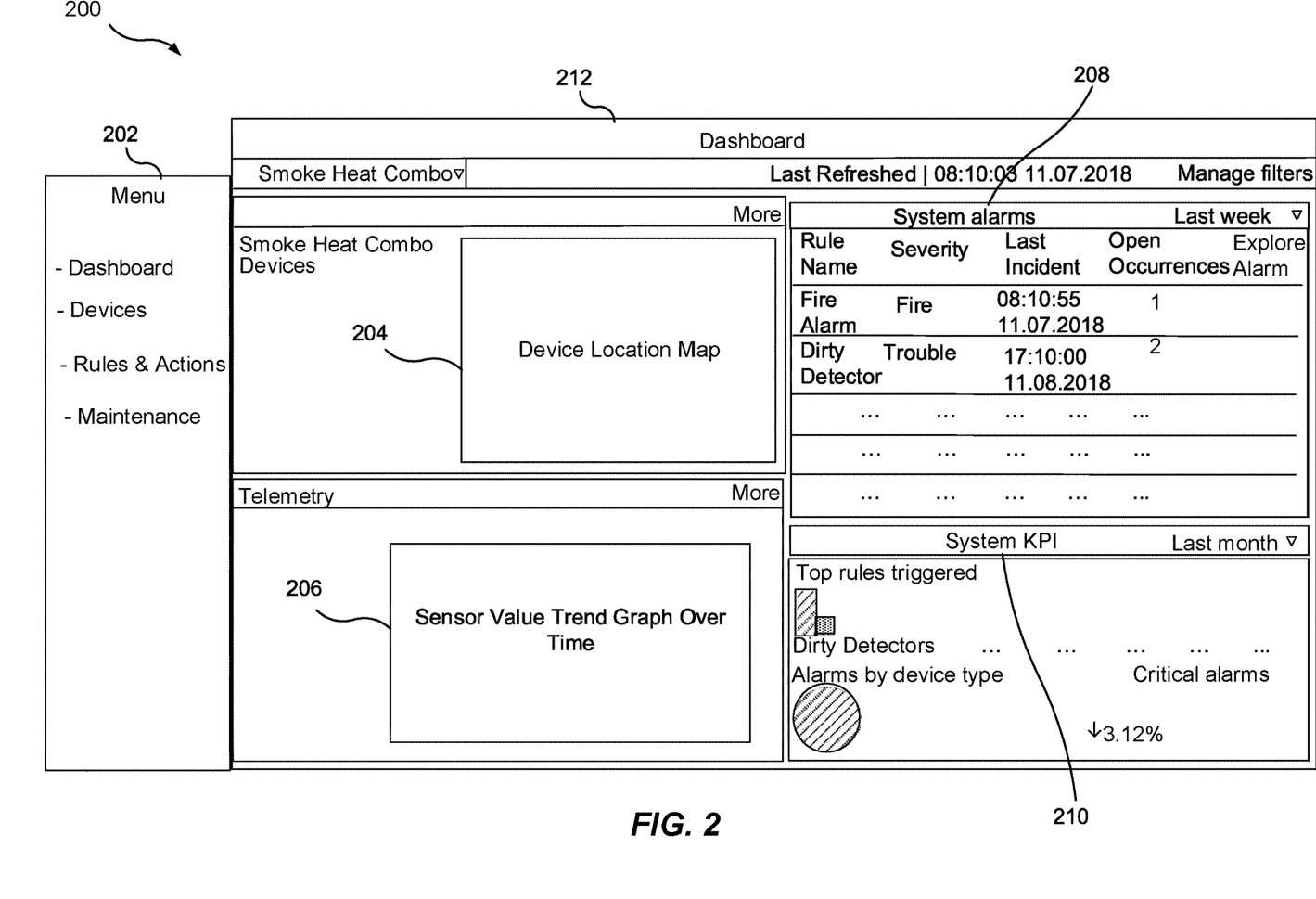
FIG. 2 is an example user interface of the de-centralized cloud-based fire protection system of FIG. 1.

Referring now to both FIGS. 1 and 2, in an aspect, the cloud platform 104 may be flexibly accessible and/or configurable via a user interface 200 including a menu 202 that allows for selecting a dashboard 212 for viewing various system status information. The menu 202 may further allow for selecting other options, e.g., to view/configure devices, rules and actions, maintenance, etc.

In an aspect, for example, at least a portion of the functionality of the user interface 200 may be accessible on a web/desktop application 124 executed on a personal computer 123. Alternatively and/or additionally, at least a portion of the functionality of the user interface 200 may be accessible on a mobile application 128 executed on a mobile device 127. Alternatively and/or additionally, at least a portion of the functionality of the user interface 200 may be accessible on a remote annunciator 126.

For example, in an aspect, the web/desktop application 124 on the personal computer 123 may be configured with restricted accessibility for authorized personnel, and various configuration settings of the de-centralized cloud-based fire protection system 100 may be adjustable by a user via the user interface 200 on the web/desktop application 124 on such a personal computer 123 that is protected by having restricted accessibility. Alternatively and/or additionally, different mobile applications 128 may be available to different user types associated with the mobile device 127. For example, in an aspect, a user may be provided the required access privileges to interact with the de-centralized cloud-based fire protection system 100 through the user interface 200 on a mobile application 128 running on a mobile device 127 associated with that user. Such flexible interfaces of the cloud platform 104 may allow for various existing and future applications to interact with the de-centralized cloud-based fire protection system 100 while ensuring highly secured access to the sensitive data stored on the cloud platform 104 to preserve data integrity.

In an aspect, the dashboard 212 may be accessed via one or more of the web/desktop application 124, the mobile application 128, or the remote annunciator 126 to view various system status information based on historical data trends of sensor values received by the cloud platform 104 from the initiating devices 102, historical safety or other events generated by the cloud platform 104, etc. For example, the dashboard 212 may provide a device location map 204, a sensor value trend graph over time 206, system alarms 208, system key performance indicators (KPI) 210, etc. For example, in an aspect, the system alarms 208 may provide detail information about various alarms triggered/generated by the cloud platform 104, such as fire alarms, dirty detectors, etc., and the detail information for each alarm may include, for example, a corresponding rule name, severity, last incident, open occurrences, etc. Further, for example, in an aspect, the system KPI 210 may provide information/statistics that characterize an overall performance of the de-centralized cloud-based fire protection system 100, such as top rules triggered, alarms by device type, percentage of critical alarms, etc.

In an aspect, the cloud platform 104 may combine data received from various initiating devices 102 of the de-centralized cloud-based fire protection system 100 with other types of available sensory input such as video camera feeds, heating, ventilation, and air conditioning (HVAC) temperature and pressure sensors, human input for validation of safety or other events, etc. For example, in one non-limiting aspect, when a fire event is triggered, the fire event may be validated/confirmed by fire personnel/authorities, for example, via the dashboard 212 and/or via the remote annunciator 126.

For example, in one non-limiting aspect, the confirmation/validation of a triggered fire event may be performed locally on site via the remote annunciator 126 when the fire department responds to the event. For example, when the fire department personnel arrive on site and determine that the triggered fire event is a false alarm, the fire department personnel may reset the de-centralized cloud-based fire protection system 100 and also acknowledge through the remote annunciator 126 that the triggered fire event is a false alarm, i.e., invalidate the triggered fire event. In this case, the remote annunciator 126 may send the validation information back to de-centralized cloud-based fire protection system 100.

In an aspect, the validation information may be stored along with other sensory inputs of the de-centralized cloud-based fire protection system 100 at the time of the fire event. Thereafter, the cloud platform 104 may process the combined stored data and validation information, for example, using machine learning 114, to improve the confidence level of a corresponding predictive detection model that generated the fire event. For example, the processing may result in reduced false alarms and/or generate a new model for predictive fire detection. In an aspect, for example, the new predictive fire detection model may improve evacuation time by generating pre-emptive alarms by comparing past input data history from multiple sources of a previous fire event with current input data that indicates the inevitability of an actual fire event.

In an aspect, for example, the cloud platform 104 may apply machine learning 114 on sensory data received from various devices across different geographical locations/climates, e.g., desert, tropical, urban, etc., and may adapt the predictive detection model to the environmental conditions specific to a specific location where the de-centralized cloud-based fire protection system 100 is installed. In an aspect, the cloud platform 104 may continue to obtain and analyze data from additional fire alarm systems to continually improve the predictive detection model.

In an alternative and/or additional aspect, for example, the cloud platform 104 may apply machine learning 114 on data stored in the persistent data storage 112 to associate certain sensor input values/trends with specific types of fire. For example, in an aspect, based on applying machine learning 114 on historical sensor and event data in the persistent data storage 112, the cloud platform 104 may determine that certain sensor input is associated with a non-threatening event, such as the lighting of an e-cigarette. In response, the cloud platform 104 may adjust the predictive detection algorithm accordingly. For example, the cloud platform 104 may adjust an event detection threshold in the predictive detection model to prevent the generation of an alarm when similar sensor input is received in the future. Optionally, in an aspect, the cloud platform 104 may perform the above-noted adjustments based on applying machine learning 114 on aggregated data from multiple devices in multiple fire protection systems/environments to reduce false alarms.

Figure 3:
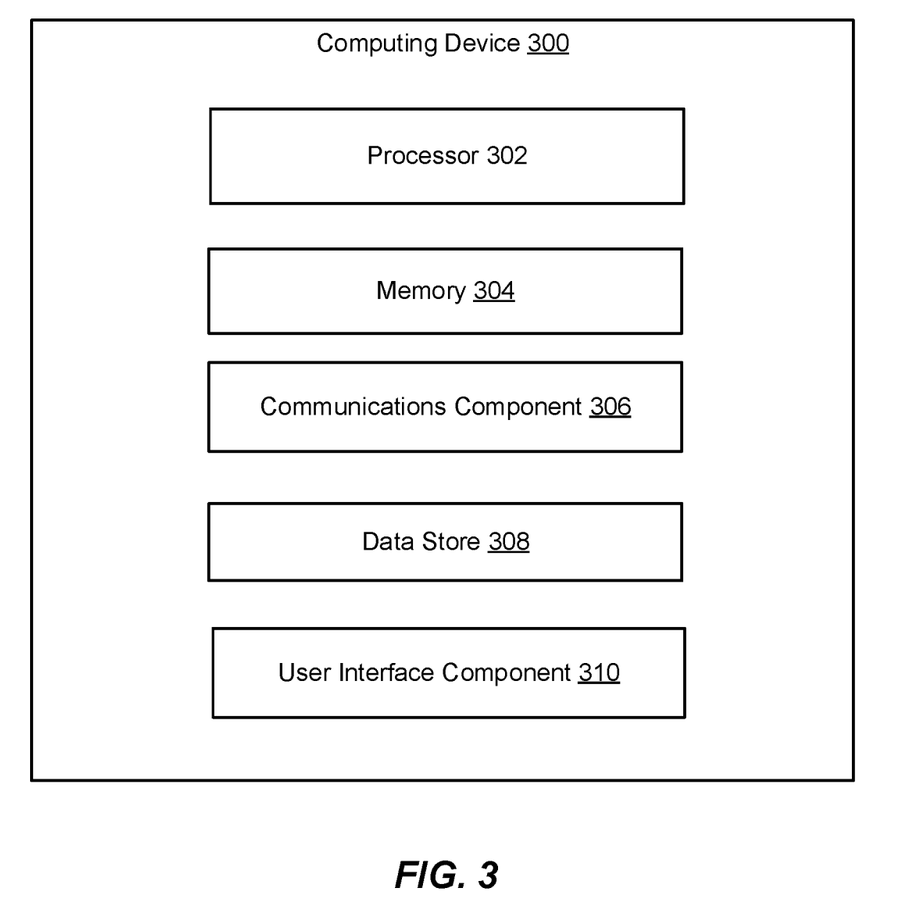
FIG. 3 is a block diagram of an example computing device which may implement a component in the example de-centralized cloud-based fire protection system of FIG. 1, or which may implement the example user interface of FIG. 2.

Referring to FIG. 3, a computing device 300 may implement all or a portion of the functionality described in FIGS. 1 and 2 above or described in FIG. 4 below. For example, the computing device 300 may be or may include at least a portion of the initiating devices 102, the cloud platform 104, the notification devices 106, the emergency control devices 108, the personal computer 123, the remote annunciator 126, the mobile device 127, or any other component described herein with reference to FIG. 1 above. The computing device 300 includes a processor 302 which may be configured to execute or implement software, hardware, and/or firmware modules that perform any functionality described herein with reference to FIGS. 1 and 2 above or with reference to FIG. 4 below. For example, the processor 302 may be configured to execute or implement software, hardware, and/or firmware modules that perform any functionality described herein with reference to the initiating devices 102, the cloud platform 104, the notification devices 106, the emergency control devices 108, the personal computer 123, the remote annunciator 126, the mobile device 127, or any other component/system/device described herein with reference to FIGS. 1 and 2 above.

The processor 302 may be a micro-controller, an application-specific integrated circuit (ASIC), or a field-programmable gate array (FPGA), and/or may include a single or multiple set of processors or multi-core processors. Moreover, the processor 302 may be implemented as an integrated processing system and/or a distributed processing system. The computing device 300 may further include a memory 304, such as for storing local versions of applications being executed by the processor 302, related instructions, parameters, etc. The memory 304 may include a type of memory usable by a computer, such as random access memory (RAM), read only memory (ROM), tapes, magnetic discs, optical discs, volatile memory, non-volatile memory, and any combination thereof. Additionally, the processor 302 and the memory 304 may include and execute an operating system executing on the processor 302, one or more applications, display drivers, etc., and/or other components of the computing device 300.

Further, the computing device 300 may include a communications component 306 that provides for establishing and maintaining communications with one or more other devices, parties, entities, etc. utilizing hardware, software, and services. The communications component 306 may carry communications between components on the computing device 300, as well as between the computing device 300 and external devices, such as devices located across a communications network and/or devices serially or locally coupled with the computing device 300. In an aspect, for example, the communications component 306 may include one or more buses, and may further include transmit chain components and receive chain components associated with a wireless or wired transmitter and receiver, respectively, operable for interfacing with external devices.

Additionally, the computing device 300 may include a data store 308, which can be any suitable combination of hardware and/or software, that provides for mass storage of information, databases, and programs. For example, the data store 308 may be or may include a data repository for applications and/or related parameters not currently being executed by processor 302. In addition, the data store 308 may be a data repository for an operating system, application, display driver, etc., executing on the processor 302, and/or one or more other components of the computing device 300.

The computing device 300 may also include a user interface component 310 operable to receive inputs from a user of the computing device 300 and further operable to generate outputs for presentation to the user (e.g., via a display interface to a display device). The user interface component 310 may include one or more input devices, including but not limited to a keyboard, a number pad, a mouse, a touch-sensitive display, a navigation key, a function key, a microphone, a voice recognition component, or any other mechanism capable of receiving an input from a user, or any combination thereof. Further, the user interface component 310 may include one or more output devices, including but not limited to a display interface, a speaker, a haptic feedback mechanism, a printer, any other mechanism capable of presenting an output to a user, or any combination thereof.

Figure 4:
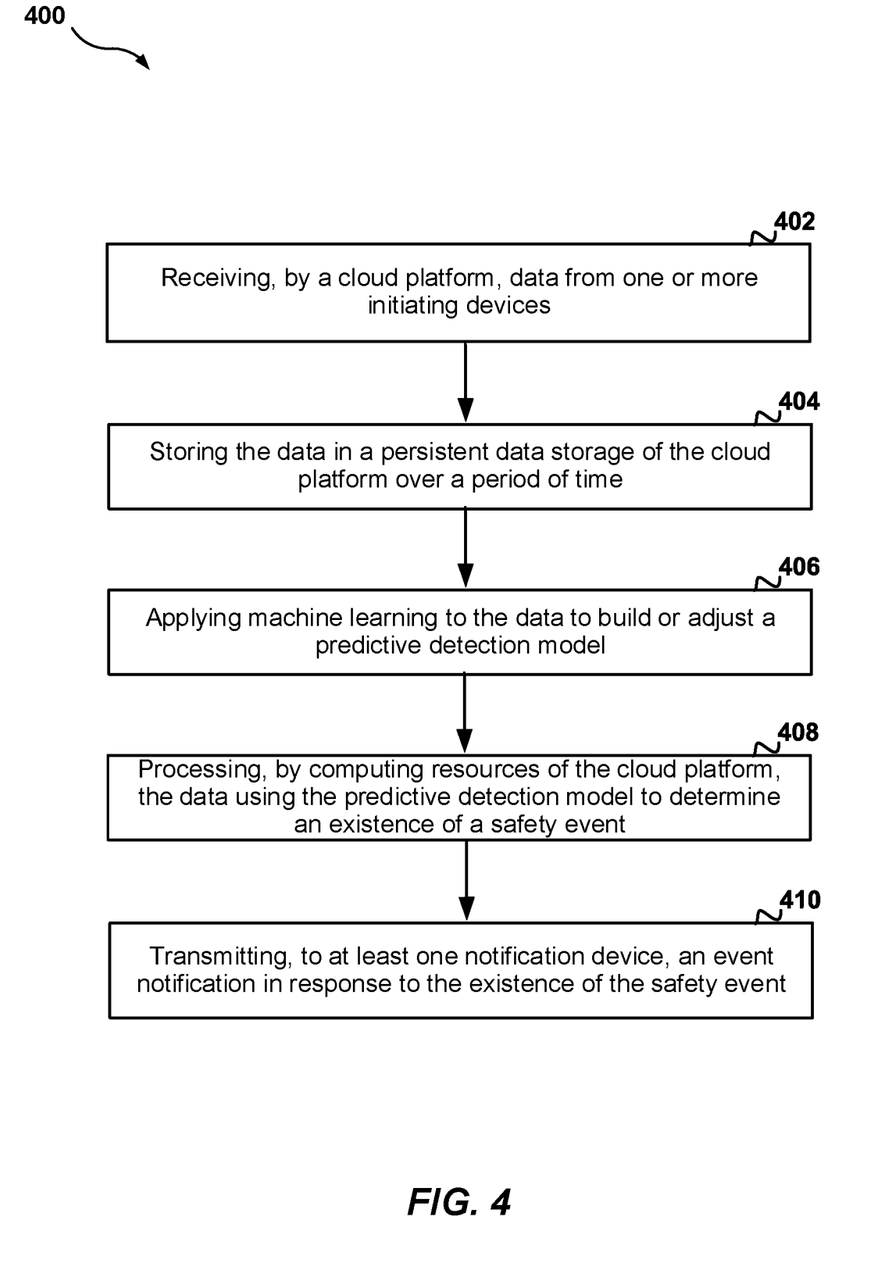
FIG. 4 is a flow diagram of an example de-centralized cloud-based fire protection method.

FIG. 4 is a flowchart of a method 400 of operation of the computing device 300. The method 400 may implement the functionality described herein with reference to FIGS. 1-3 above, and may be performed by one or more components of the computing device 300 or any device/component described herein with reference to FIGS. 1-3 above.

At 402 the method 400 includes receiving, by a cloud platform, data from one or more initiating devices. For example, in an aspect, the cloud platform 104 may receive data from one or more of the initiating devices 102. Optionally, in an aspect, for example, the one or more initiating devices may include one or more on premise fire protection devices, such as smoke detectors. Optionally, in an aspect, for example, the one or more initiating devices 102 may communicate with the cloud platform 104 over the Internet.

Optionally, in an aspect, for example, the cloud platform 104 may receive raw sensor data from the one or more initiating devices 102. For example, the initiating device 102 may be a digital sensor device such as a manual pull station, and the cloud platform 104 may receive digital device values from the digital initiating device 102.

Optionally, in an aspect, for example, the initiating device 102 may be an analog sensor device such as a smoke detector. In this case, the cloud platform 104 may also receive processed data generated by processing the raw sensor data by the initiating device 102 or by one or more hubs, routers, gateways, or some combination thereof that couple the one or more initiating devices 102 with the cloud platform 104.

At 404 the method 400 includes storing the data in a persistent data storage of the cloud platform over a period of time. For example, in an aspect, the cloud platform 104 may store the data received from the initiating devices 102 in the persistent data storage 112 over a period of time.

At 406 the method 400 includes applying machine learning to the data to build or adjust a predictive detection model. For example, in an aspect, the cloud platform 104 may apply machine learning 114 to the data stored in the persistent data storage 112 to build or adjust a predictive detection model used to implement fire protection functionality in the de-centralized cloud-based fire protection system 100.

In one aspect, for example, the machine learning 114 may further receive human input regarding validation/invalidation of a safety event, for example, via the dashboard 212 and/or via the remote annunciator 126. In response, the machine learning 114 may be trained in order to adjust the predictive detection model based on the available sensor and/or validation data and/or other historical data stored in the persistent data storage 112. In an aspect, for example, the machine learning 114 may implement a feedback loop where absence of human input/validation is considered a true event while an invalidation by human input is considered a false event, and the machine learning 114 may use the feedback loop to adjust the predictive detection model accordingly.

Optionally, in an aspect, for example, the cloud platform 104 may apply machine learning to the data received from the initiating devices 102 and to other data received from other devices configured in a different geographical or logical system than the initiating devices 102. For example, in an aspect, the cloud platform 104 may apply machine learning 114 to a combination of data received from the initiating devices 102 associated with a geographical or logical system, such as the de-centralized cloud-based fire protection system 100, as well as data received from other devices configured in a different geographical or logical system, a different floor, zone, building, etc., as compared to the initiating devices 102.

Optionally, in an aspect, for example, the cloud platform 104 may apply machine learning to extract a pattern indicative of a type of fire, and then adjust a fire event detection threshold of the predictive detection model based on the pattern. For example, in an aspect, the cloud platform 104 may apply machine learning 114 on the data accumulated in the persistent data storage 112 over time to extract a pattern indicative of a type of fire, and then adjust a corresponding fire event detection threshold of the predictive detection model based on the pattern. For example, in an aspect, based on applying machine learning 114 on historical sensor and event data in the persistent data storage 112, the cloud platform 104 may determine that certain sensor input is associated with a non-threatening event, such as the lighting of an e-cigarette. In response, the cloud platform 104 may adjust an event detection threshold in the predictive detection model to prevent the generation of a fire alarm when similar sensor input is received in the future. Accordingly, the cloud platform 104 may reduce the likelihood of generating a false alarm.

At 408 the method 400 includes processing, by computing resources of the cloud platform, the data using the predictive detection model to determine an existence of a safety event. For example, in an aspect, the computing resources of the cloud platform 104 may be used to process the data received from the initiating devices 102 using the machine learning-trained predictive detection model to determine an existence of a safety event such as a fire event. For example, in an aspect, the computing resources of the cloud platform 104 may be used to implement data and event processing 116 and/or rules and logic processing 118 to process the data using the predictive detection model to determine an existence of a safety event such as a fire event.

Optionally, in an aspect, for example, the cloud platform 104 may process the data by comparing the data against an event threshold or identifying a signal pattern of the data, and determining the existence of the safety event in response to the comparing or the identifying. For example, in an aspect, the cloud platform 104 may perform rules and logic processing 118 on analog device values received from an analog initiating device 102 and compare the analog device values against a configurable threshold range to trigger a state change associated with the initiating device 102 if the analog device values are not within an acceptable range. In an aspect, the threshold value may be configured manually or may be computed using machine learning 114 and configured automatically by the cloud platform 104. Alternatively and/or additionally, for example, in an aspect, the rules and logic processing 118 may identify a signal pattern of the analog device values to trigger a state change associated with the initiating device 102 if the signal pattern of the analog device values matches a pattern associated with a safety event. In response to a triggered state change based on comparing the analog device values with a threshold and/or based on identifying a pattern in the analog signal values, the rules and logic processing 118 may determine whether to generate a corresponding safety event.

At 410 the method 400 includes transmitting, to at least one notification device, an event notification in response to the existence of the safety event. For example, in an aspect, the cloud platform 104 may transmit, to at least one notification device 106, an event notification in response to the existence of the safety event. Optionally, in an aspect, for example, the cloud platform 104 may communicate with the notification device(s) 106 over the Internet. Optionally, in an aspect, for example, the cloud platform 104 may transmit the event notification to a remote annunciator 126. Alternatively and/or additionally, for example, in another optional aspect, the cloud platform 104 may transmit the event notification to a personal computer or a personal mobile device. Optionally, in an aspect, for example, the event notification may include one or more of an email, a text message, a mobile push notification, etc.

Optionally, in an aspect, for example, the method 400 may further include receiving, via an interface of the cloud platform, a user input indicating an invalidation of the safety event, and adjusting a corresponding event detection threshold in the predictive detection model in response to the invalidation. For example, in an aspect, a safety event generated by the cloud platform 104 may be identified by a user/supervisor as being a false alarm. In this case, the user/supervisor may use the dashboard 212 to invalidate the safety event and indicate the safety event to be a false alarm. In response, the cloud platform 104 may adjust a corresponding threshold in the predictive detection model to reduce the likelihood of generating a similar false alarm in the future.

Optionally, in an aspect, for example, the method 400 may further include monitoring a connectivity of the one or more initiating devices and the at least one notification device with the cloud platform, and generating a lost connectivity indication when the connectivity is lost. For example, in an aspect, the cloud platform 104 may monitor a connectivity of the initiating devices 102 and the notification devices 106 with the cloud platform 104, and may generate a lost connectivity indication when the connectivity is lost. Optionally, in an aspect, for example, the lost connectivity indication may include one or more of an audible alarm, a visual alarm, a text message, an email, etc. For example, the cloud platform 104 may generate a lost connectivity indication by activating an audible or visual on premise fire alarm notification device 106, by causing an audible, visual, and/or textual alarm on the dashboard 212 (FIG. 2), or by sending an email or text message to a personal notification device 106 such as a mobile or other personal device. Alternatively and/or additionally, the cloud platform 104 may generate a lost connectivity indication by transmitting a trouble event to a remote annunciator 126 coupled with the cloud platform 104 via the system control interface 122.

Accordingly, for example, in an aspect, the cloud platform 104 may warn the user and/or the safety personnel by causing an audible, visual, and/or textual alarm on the dashboard 212 (FIG. 2) provided on the remote annunciator 126, the personal computer 123, or the mobile device 127 carried by and/or otherwise accessible by the user/safety personnel. Alternatively and/or additionally, the cloud platform 104 may warn the user and/or the safety personnel by sending an email or text message to a personal notification device 106 such as a mobile or other personal device of the user and/or the safety personnel.

Optionally, in an aspect, for example, the cloud platform 104 may determine the connectivity based on a regularity of reception of the data from the one or more initiating devices 102. For example, in an aspect, an initiating device 102 may be configured/expected to send periodic/regular sensor data to the cloud platform 104. In this case, the cloud platform 104 may monitor the connectivity of the initiating device 102 based on a regularity/periodicity of the reception of the sensor data from the initiating device 102, and may determine that connectivity with the initiating device 102 is lost when the initiating device 102 fails to send regular/periodic sensor data to the cloud platform 104.

Optionally, in an aspect, for example, the cloud platform 104 may determine the connectivity based on a periodic status report from the one or more initiating devices 102 or from the at least one notification device 106. For example, in an aspect, an initiating device 102 or a notification device 106 may be configured/expected to send periodic/regular operational status updates to the cloud platform 104. In an aspect, the operational status update may indicate an operational status of the initiating device 102 or the notification device 106, e.g., whether device self-tests have been successful. Alternatively and/or additionally, the status update may be dedicated for connectivity reporting of the initiating device 102 or the notification device 106. In either case, the cloud platform 104 may monitor the connectivity of the initiating device 102 or the notification device 106 based on a periodicity/regularity of the reception of the status updates from the initiating device 102 or from the notification device 106. In an aspect, the cloud platform 104 may determine that connectivity with the initiating device 102 or the notification device 106 is lost when the initiating device 102 or the notification device 106 fails to timely send the periodic/regular status updates to the cloud platform 104.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of cloud-based fire protection, comprising:
    receiving, by a cloud platform, data from one or more fire protection devices, wherein the one or more fire protection devices are configured to communicate with the cloud platform to collectively provide a fire alarm system associated with a geographical or logical system;
    storing the data in a persistent data storage of the cloud platform over a period of time;
    applying machine learning to the data received from the one or more fire protection devices and to other data received from other fire protection devices configured in a different geographical or logical system, to extract a pattern indicative of a type of fire being threatening or non-threatening;
    adjusting a fire event detection threshold of a predictive detection model based on the pattern;
    processing, by computing resources of the cloud platform, the data using the predictive detection model to determine an existence of a safety event; and
    transmitting, to at least one notification device, an event notification in response to the existence of the safety event.

2. The method of claim 1, wherein the processing of the data comprises:
    comparing the data against an event threshold or identifying a signal pattern of the data; and
    determining the existence of the safety event in response to the comparing or the identifying.

3. The method of claim 1, wherein the one or more fire protection devices communicate with the cloud platform over the Internet.

4. The method of claim 1, wherein the cloud platform communicates with the at least one notification device over the Internet.

5. The method of claim 1, wherein the at least one notification device comprises a remote annunciator.

6. The method of claim 1, wherein the at least one notification device comprises a personal computer or a personal mobile device.

7. The method of claim 1, wherein the event notification comprises at least one of an email, a text message, or a mobile push notification.

8. The method of claim 1, wherein the receiving of the data comprises receiving raw sensor data from the one or more fire protection devices.

9. The method of claim 8, wherein the receiving of the data further comprises receiving processed data generated by processing the raw sensor data by the one or more fire protection devices or by one or more hubs, routers, gateways, or a combination thereof, that couple the one or more fire protection devices with the cloud platform.

10. The method of claim 1, further comprising:
    monitoring, by the cloud platform, a connectivity of the one or more fire protection devices and the at least one notification device with the cloud platform; and
    generating, by the cloud platform, a lost connectivity indication when the connectivity is lost.

11. The method of claim 10, wherein the lost connectivity indication comprises one or more of an audible alarm, a visual alarm, a text message, or an email.

12. The method of claim 10, wherein the monitoring comprises:
  determining, by the cloud platform, the connectivity based on a regularity of reception of the data by the cloud platform from the one or more fire protection devices.

13. The method of claim 10, wherein the monitoring comprises:
  determining, by the cloud platform, the connectivity based on a periodic status report received by the cloud platform from the one or more fire protection devices or from the at least one notification device.

14. The method of claim 1, further comprising:
  receiving, via an interface of the cloud platform, a user input indicating an invalidation of the safety event; and
  adjusting a corresponding event detection threshold in the predictive detection model in response to the invalidation.

15. The method of claim 1, wherein the one or more fire protection devices are logically grouped together in a zone, a building floor, a building section, a building, a building complex, or a campus.

16. The method of claim 1, wherein the one or more fire protection devices are configured to communicate with the cloud platform to collectively provide the fire alarm system without a need for association with a local fire panel control unit.

17. The method of claim 1, wherein the fire alarm system is a de-centralized cloud-based fire protection system that includes a local fire alarm control panel, wherein the local fire alarm control panel is configured as a gateway to the Internet to couple the one or more fire protection devices with the cloud platform such that the cloud platform processes business logic of the fire alarm system.

18. A system for cloud-based fire protection, comprising:
  one or more processors providing computing resources for a cloud platform; and
  a memory storing instructions that, when executed by the one or more processors, cause the one or more processors to:
    receive, by the cloud platform, data from one or more fire protection devices, wherein the one or more fire protection devices are configured to communicate with the cloud platform to collectively provide a fire alarm system associated with a geographical or logical system;
    store the data in a persistent data storage of the cloud platform over a period of time;
    apply machine learning to the data received from the one or more fire protection devices and to other data received from other fire protection devices configured in a different geographical or logical system, to extract a pattern indicative of a type of fire being threatening or non-threatening;
    adjust a fire event detection threshold of a predictive detection model based on the pattern;
    process the data using the predictive detection model to determine an existence of a safety event; and
    transmit, to at least one notification device, an event notification in response to the existence of the safety event.

19. The system of claim 18, wherein the one or more fire protection devices and the at least one notification device communicate with the cloud platform over the Internet.

20. A non-transitory computer-readable medium storing instructions that, when executed by one or more processors providing computing resources for a cloud platform, cause the one or more processors to:
  receive, by the cloud platform, data from one or more fire protection devices, wherein the one or more fire protection devices are configured to communicate with the cloud platform to collectively provide a fire alarm system associated with a geographical or logical system;
  store the data in a persistent data storage of the cloud platform over a period of time;
  apply machine learning to the data received from the one or more fire protection devices and to other data received from other fire protection devices configured in a different geographical or logical system, to extract a pattern indicative of a type of fire being threatening or non-threatening;
  adjust a fire event detection threshold of a predictive detection model based on the pattern;
  process the data using the predictive detection model to determine an existence of a safety event; and
  transmit, to at least one notification device, an event notification in response to the existence of the safety event.

* * * * *